United States Patent
Manning et al.

(10) Patent No.: US 7,613,024 B2
(45) Date of Patent: *Nov. 3, 2009

(54) LOCAL DIGIT LINE ARCHITECTURE AND METHOD FOR MEMORY DEVICES HAVING MULTI-BIT OR LOW CAPACITANCE MEMORY CELLS

(75) Inventors: H. Montgomery Manning, Boise, ID (US); Howard Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/983,617

(22) Filed: Nov. 9, 2007

(65) Prior Publication Data

US 2008/0062737 A1    Mar. 13, 2008

Related U.S. Application Data

(63) Continuation of application No. 11/271,024, filed on Nov. 10, 2005, now Pat. No. 7,310,257.

(51) Int. Cl.
*G11C 5/06* (2006.01)
*G11C 7/00* (2006.01)
*G11C 8/00* (2006.01)

(52) U.S. Cl. .................. 365/63; 365/205; 365/207; 365/208; 365/230.03; 365/230.06

(58) Field of Classification Search .............. 365/63, 365/203, 205, 207, 208, 230.03, 230.06, 365/203.03; 330/252; 265/205, 207, 208, 265/230.03

See application file for complete search history.

(56) References Cited

U.S. PATENT DOCUMENTS

| | | | |
|---|---|---|---|
| 5,367,488 A | 11/1994 | An ..................... | 365/189.01 |
| 5,570,319 A | 10/1996 | Santoro et al. ......... | 365/230.03 |
| 5,600,602 A | 2/1997 | Seyyedy ................. | 365/205 |
| 5,646,900 A * | 7/1997 | Tsukude et al. ........... | 365/207 |
| 5,701,269 A | 12/1997 | Fujii ..................... | 365/210 |
| 5,717,645 A | 2/1998 | Kengeri et al. ......... | 365/230.01 |
| 5,724,301 A | 3/1998 | Seyyedy ................. | 365/230.03 |
| 5,734,620 A | 3/1998 | Seyyedy ................. | 365/230.03 |
| 5,828,594 A | 10/1998 | Fujii ..................... | 365/63 |
| 5,844,833 A | 12/1998 | Zagar et al. ............. | 365/149 |
| 5,923,605 A | 7/1999 | Mueller et al. ......... | 365/230.03 |
| 5,973,983 A | 10/1999 | Hidaka ................. | 365/230.03 |
| 5,991,217 A | 11/1999 | Tavrow et al. .......... | 365/208 |

(Continued)

*Primary Examiner*—Trong Phan
(74) *Attorney, Agent, or Firm*—Dorsey & Whitney LLP

(57) ABSTRACT

A DRAM array includes for each column a pair of complimentary digit lines that are coupled to a sense amplifier. Each of the global digit lines is selectively coupled to a plurality of local digit lines by respective coupling circuits. The length of the local digit lines is substantially shorter than the length of the global digit lines. As a result, the local digit lines have substantially less capacitance so that a voltage stored by a memory cell capacitor can be more easily transferred to the local digit line. The coupling circuits provide current amplification so that the voltage on the local digit lines can be more easily transferred to the global digit lines. A write back circuit is coupled to the local digit line to restore the voltage of the memory cell capacitor.

28 Claims, 4 Drawing Sheets

U.S. PATENT DOCUMENTS

| | | | |
|---|---|---|---|
| 6,023,421 A | 2/2000 | Clinton et al. | 365/63 |
| 6,088,276 A | 7/2000 | Ukita | 365/207 |
| 6,091,629 A | 7/2000 | Osada et al. | 365/156 |
| 6,091,633 A | 7/2000 | Cernea et al. | 365/185.13 |
| 6,178,134 B1 | 1/2001 | Evans et al. | 365/230.03 |
| 6,292,421 B1 | 9/2001 | Shore et al. | 365/222 |
| 6,310,809 B1 | 10/2001 | Roohparvar et al. | 365/203 |
| 6,396,728 B1 | 5/2002 | Abedifard et al. | 365/63 |
| 6,426,905 B1 | 7/2002 | Dennard et al. | 365/204 |
| 6,496,425 B1 | 12/2002 | Abedifard et al. | 365/200 |
| 6,515,894 B2 | 2/2003 | Osada et al. | 365/156 |
| 6,522,565 B2 | 2/2003 | Shimazaki et al. | 365/63 |
| 6,532,174 B2 | 3/2003 | Homma et al. | 365/185.2 |
| 6,625,070 B2 | 9/2003 | Ueno et al. | 365/198 |
| 6,657,913 B2 | 12/2003 | Abedifard et al. | 365/230.03 |
| 6,665,209 B2 | 12/2003 | Osada et al. | 365/154 |
| 6,665,221 B2 | 12/2003 | Abedifard et al. | 365/200 |
| 6,665,222 B2 | 12/2003 | Wright et al. | 365/203 |
| 6,671,214 B2 | 12/2003 | Abedifard et al. | 365/200 |
| 6,678,198 B2 | 1/2004 | Issa et al. | 365/207 |
| 6,711,051 B1 | 3/2004 | Poplevine et al. | 365/154 |
| 6,728,125 B2 | 4/2004 | Hong | 365/51 |
| 6,735,120 B2 | 5/2004 | Homma et al. | 365/185.2 |
| 6,735,135 B2 | 5/2004 | Issa | 365/205 |
| 6,741,491 B2 | 5/2004 | Pöchmüller | 365/149 |
| 6,768,663 B2 | 7/2004 | Ogata | 365/63 |
| 6,822,904 B2 | 11/2004 | Gallo et al. | 365/185.21 |
| 6,901,017 B2 | 5/2005 | Shimizu | 365/203 |
| 6,930,941 B2 | 8/2005 | Nakase | 365/205 |
| 6,982,902 B2 | 1/2006 | Gogl et al. | 365/158 |
| 6,982,920 B2 | 1/2006 | Chevallier | 365/230.02 |
| 7,061,817 B2 | 6/2006 | Raad et al. | 365/201 |
| 7,161,429 B2 * | 1/2007 | Boreysha et al. | 330/252 |
| 2002/0105846 A1 | 8/2002 | Dennard et al. | 365/225.7 |
| 2002/0131312 A1 | 9/2002 | Issa et al. | 365/207 |
| 2002/0172076 A1 | 11/2002 | Marotta et al. | 365/185.21 |
| 2003/0048681 A1 | 3/2003 | Gallo et al. | 365/203 |
| 2004/0130926 A1 | 7/2004 | Nakase | 365/145 |
| 2005/0052922 A1 | 3/2005 | Park et al. | 365/222 |
| 2005/0073879 A1 | 4/2005 | Gogl et al. | 365/158 |
| 2005/0141324 A1 | 6/2005 | Ko et al. | 365/230.03 |
| 2005/0207242 A1 | 9/2005 | Yabe | 365/200 |

* cited by examiner

LOCAL DIGIT LINE ARCHITECTURE AND METHOD FOR MEMORY DEVICES HAVING MULTI-BIT OR LOW CAPACITANCE MEMORY CELLS

CROSS-REFERENCE TO RELATED APPLICATION

This application is a continuation of pending U.S. patent application Ser. No. 11/271,024, filed Nov. 10, 2005.

TECHNICAL FIELD

This invention relates to memory devices, and, more particularly, to a memory device architecture and method that allows data to be more compactly stored in dynamic random access memory devices.

BACKGROUND OF THE INVENTION

Memory devices are commonly used to store data in a wide variety of electronic systems, such as personal computers. Several distinct types of memory devices exist, such as dynamic random access memory ("DRAM") devices, static random access memory ("SRAM") devices, and read only memory devices ("ROM"). Each of these devices has specific attributes that make them particularly suited for various uses. DRAM devices, for example, have a significant advantage in being able to store data very compactly since significantly less circuitry is required to store each bit of data compared to, for example, SRAM devices. For this reason, DRAM devices are commonly used in applications where a large amount of data must be stored. For example, DRAM devices commonly serve as system memory in personal computers. DRAM devices store data in DRAM cells, each of which is capable of storing one bit of data. Each DRAM cell requires only a storage capacitor for storing either of two voltages corresponding to respective Boolean numbers, and an access transistor for selectively isolating the capacitor.

As with virtually any device in the field of electronics, attempts are continuously being made to improve their performance and lower their cost. Performance improvements in DRAM devices have generally focused on improving their speed, reducing the amount of power they consume, or increasing the amount of data they can store. Cost improvements have generally focused on reducing the size of DRAM devices because doing so allows more devices to be fabricated on each wafer, and manufacturing costs are heavily dependent on the cost to process each wafer. Reducing the size of DRAM devices generally involves making the circuitry used in the devices more compact by reducing the feature size as much as possible according to specific design rules. Making the circuitry used in DRAM devices more compact not only reduces the cost of DRAM devices, but it also has the effect of increasing their storage capacity, and, to some extent, increasing their operating speed.

With each generation of DRAM devices, their circuitry has become more compact. However, despite reductions in the minimum feature size of such circuitry, a limit to the amount of data that can be stored is always reached. Furthermore, the theoretical limit to reducing the feature size of semiconductor circuitry using existing technology may be near. DRAM devices could be made more compact if the capacitance of storage capacitors used in DRAM cells could be reduced. The voltage stored by a DRAM cell capacitor is sensed by the access transistor selectively coupling the capacitor to a digit line. However, the voltage stored by the capacitor is not simply transferred to the digit line because the digit line itself can have substantial capacitance. The actual change in the digit line voltage is proportional to the capacitance of the digit line compared to that of the capacitor. The voltage change $\Delta V$ is given by the formula:

$$\Delta V = (V_C - V_D)(C_C/C_C + C_D),$$

where $V_C$ is the voltage stored by the capacitor, $V_D$ is the voltage to which the digit line is precharged, $C_C$ is the capacitance of the memory cell capacitor, and $C_D$ is the capacitance of the digit line. It can be seen from the above formula that $\Delta V$ becomes smaller as $C_D$ becomes larger. For values of $C_D$ that are very much larger than $C_C$, $\Delta V$ can approach zero. The magnitude of $\Delta V$ also becomes smaller if $V_C - V_D$ becomes smaller. The voltage stored by the capacitor, $V_C$, is usually either 0 volts or the supply voltage, $V$. The voltage to which the digit line is charged, $V_D$, is usually one-half the supply voltage, or $V/2$. Therefore, the value of $V_C - V_D$ is normally either $V/2$ (if $V_C$ is $V$) or $-V/2$ (if $V_C$ is 0 volts). In either case, since the magnitude of $\Delta V$ is directly proportional to the magnitude of $V$.

Regardless of whether $\Delta V$ becomes very small because the digit line capacitance $C_D$ has become very large or because the supply voltage $V$ has become very small, a small value of $\Delta V$ can make it difficult to determine the voltage $V_C$ to which the capacitor was initially charged. It will then be difficult to read the value of a data bit stored in a DRAM memory cell.

It can also be seen from the above formula that $\Delta V$ can be increased by increasing $C_C$ and decreasing $C_D$. In fact, $\Delta V$ can be made to approach the full difference between $V_C$ and $V_D$, i.e., the digit line voltage can change to $V_C$, by making $C_C$ much larger than $C_D$. However, making $C_C$ significantly larger generally involves making memory cell capacitors significantly larger, thus making memory cells significantly less compact. This has the effect of reducing storage capacity and increasing cost. Making $C_D$ significantly smaller would also solve the problem. But long digit lines, which have large capacitances, are desired so that each digit line can be coupled to a large number of DRAM cells. Therefore, as a practical matter, the capacitance of DRAM cell capacitors cannot be reduced, thus precluding reductions in the size of DRAM cell capacitors.

One approach to storing data more compactly in DRAM devices that does not rely on reducing the feature size of DRAM circuitry is to store more than one bit in each DRAM cell. As mentioned above, the capacitor in each DRAM cells traditionally stores either of two voltages corresponding to respective Boolean numbers. Thus, each capacitor stores one bit of data. Proposals have been made to store two or more bits of data in each DRAM cell by storing one of four voltage levels in each DRAM cell capacitor. In general terms, a DRAM cell capacitor can store N bits of data by allowing the capacitor to store $2^N$ different voltage levels. By allowing multiple bits of data to be stored in each DRAM cell, the storage capacity of a DRAM device can be greatly increased without adding a significant amount of additional circuitry.

Despite the voltage sensing problems inherent in using small capacitors and long digit lines, it is relatively easy to sense the voltage level stored in a DRAM cell capacitor when the capacitor is storing one of only two voltage levels. Conventional sense amplifiers for memory cells storing only a single bit must only sense whether the digit line voltage has increased or decreased from a voltage to which the digit line was precharged prior to the memory cell being coupled to the digit line. It is significantly more difficult to do so when the capacitor is storing four or more voltage levels. Conventional sense amplifiers for memory cells storing multiple bits must sense the degree to which the digit line voltage has increased or decreased from the digit line precharge voltage. Therefore, although storing multiple bits of data in each DRAM cell has significant advantages, doing so is not without significant problems. If the signal to be sensed, i.e., the change in the digit line voltage ΔV becomes very small, it can be masked by noise inherently present in the digit line. For example, if an access transistor connects a digit line to a capacitor that stores a larger voltage, the digit line voltage should increase. However, noise on the digit line can momentarily increase or decrease the digit line voltage, thereby causing the incorrect voltage to be sensed. This "signal-to-noise" ration problem has been a significant impediment to the practical implementation of multiple bit DRAM memory cells.

There is therefore a need for a DRAM architecture and method that allows the capacitance of DRAM cell capacitors to be reduced and/or allows multiple bits of data to be stored in each memory cell without unduly reducing storage capacity, reducing performance, or increasing cost.

SUMMARY OF THE INVENTION

A dynamic random access memory ("DRAM") array and method includes a plurality of memory cells arranged in rows and columns. Each column of the DRAM array includes a sense amplifier operable to sense a voltage difference applied between first and second inputs. The first and second inputs are coupled to first and second global digit lines. A plurality of coupling circuits selectively couple the first global digit line to respective local digit lines. Similarly, a plurality of coupling circuits selectively couple the second global digit line to respective local digit lines. Each of the local digit lines is coupled to a plurality of memory cells. In operation, a memory cell is coupled to a local digit line so a voltage is placed on the local digit line corresponding the value of one or more data bits stored in the memory cell. The signal on the local digit line is then transferred to the global digit line, preferably through a coupling circuit providing voltage or current gain. The sense amplifier then determines the value of the data bit stored in the memory cell based on the voltage or current of the global digit line. The DRAM array preferably includes a precharge circuit coupled to the first and second global digit lines. The precharge circuit selectively biases the first and second global digit lines to precharge voltages, and, by coupling a global digit line to a local digit line, also precharges the local digit line and any selected memory cells.

DETAILED DESCRIPTION

Figure 1:
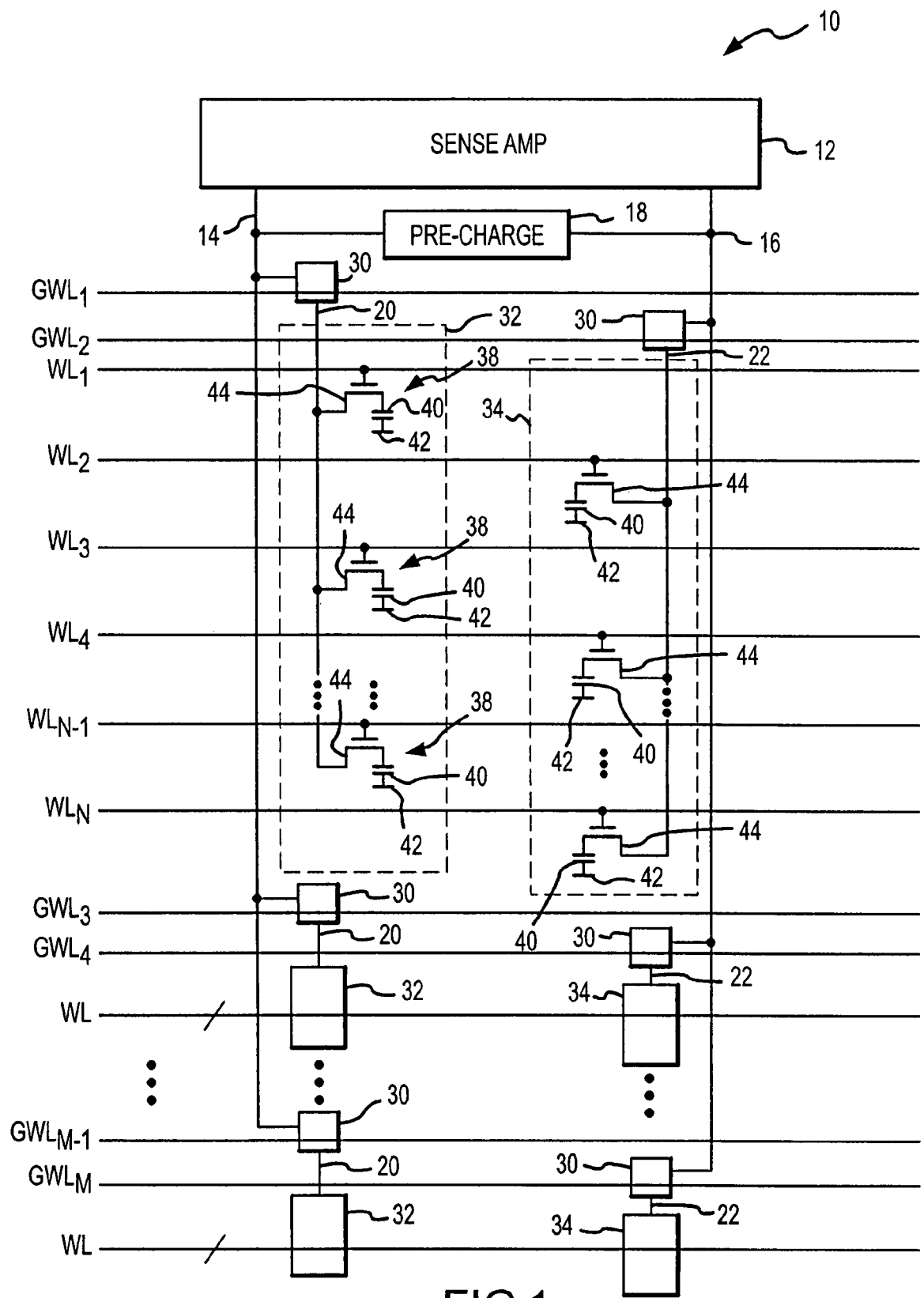
FIG. 1 is a schematic diagram showing an entire column of a DRAM array according one example of the invention.

FIG. 1 shows an entire column of a DRAM array 10 according to one example of the invention. The DRAM array 10 includes a convention multi-level sense amplifier 12, which can sense the magnitude of voltages applied to its inputs in at least four ranges. The inputs of the sense amplifier 12 are coupled to respective complimentary global digit lines 14, 16. A precharge circuit 18 is also coupled to the global digit lines 14, 16. The precharge circuit 18 precharges the global digit lines 14, 16 to a predetermined precharge voltage before a memory access is to occur. Each of the global digit lines 14, 16 is selectively coupled to a plurality of local digit lines 20, 22, by respective coupling circuits 30. The local digit lines 20, 22 are coupled to respective sets 32, 34 of memory cells 38. Each memory cell 38 includes a capacitor 40 having one of its plates coupled to a cell plate 42. The cell plate 42 is normally common to all of the capacitors 40 in the array 10, and it is normally biased to one-half the supply voltage. The memory cell 38 also includes an access transistor 44 that selectively couples the other plate of the capacitor to one of the local digit lines 20, 22. The gate of each access transistor 44 is coupled to a respective word line WL, which is normally also coupled to each access transistor 44 in its respective row. The odd-numbered word lines WL are coupled to the gates of access transistors 44 that are coupled to the local digit lines 20, and the even-numbered word lines WL are coupled to the gates of access transistors 44 that are coupled to the complimentary local digit lines 22. The coupling circuits 30 are enabled by global word lines GWL to couple respective local digit lines 20, 22 to the global digit lines 14, 16, respectively. Each of the global word lines GWL is activated to enable its respective coupling circuit 30 whenever a word line WL for any of the memory cells 38 coupled to the respective local digit line 20, 22 is activated. Thus, the signals applied to the global word lines GWL can be generated by simply detecting that an active signal has been applied to an associated word line WL.

Each of the local digit lines 20, 22 can be coupled to relatively few memory cells 38 thus allowing the local digit lines 20, 22 to be relatively short. In one example of the array 10, each of the local digit lines 20, 22 is coupled to 64 memory cells 38. As a result, the capacitance of the local digit lines 20, 22 can be relatively small, thus allowing the capacitance of the capacitors 40 in the memory cells 38 to be reduced. Furthermore, the signal-to-noise ratio of the voltage transferred from each capacitor 40 to the local digit line 20 or 22 to which it is coupled it therefore relatively high. Despite the short length of the local digit lines 20, 22, the storage capacity of the array 10 is not limited because the global digit lines 14, 16 can be very long. The long global digit lines 14, 16 may have a capacitance that is substantially larger than the capacitance of the local digit lines 20, 22. However, the voltage on local digit lines 20, 22 is substantially transferred to the global digit lines 14, 16 because the coupling circuits 30 are preferably amplifiers having current or voltage gain characteristics. The sense amplifier 12 is therefore able to determine the voltage stored by the capacitor 40 being read with relative ease.

Figure 2:
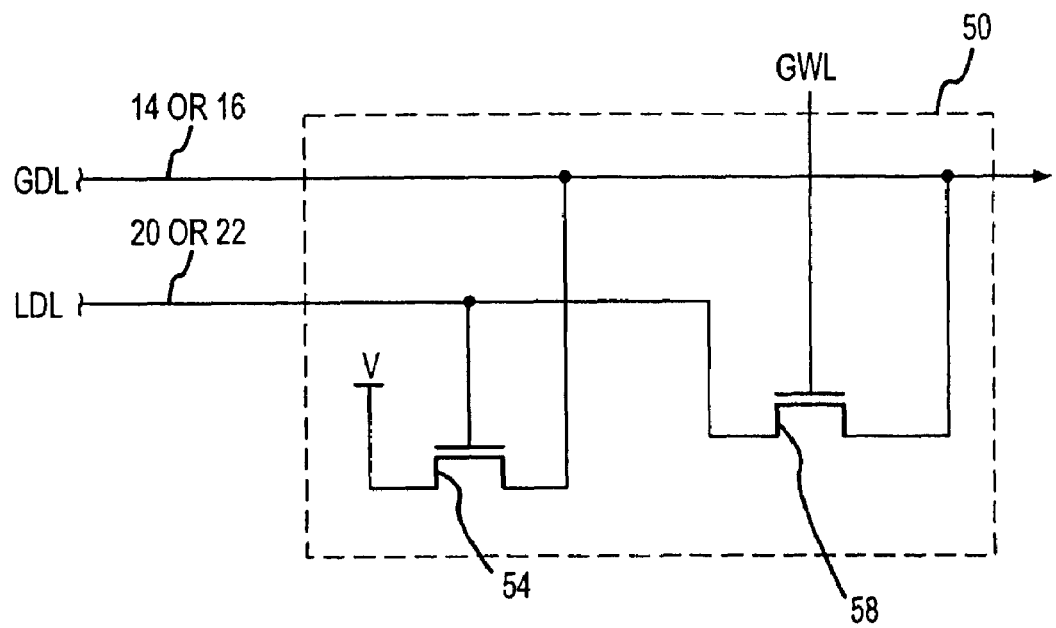
FIG. 2 is a schematic diagram showing a portion of a DRAM array coupling local digit lines to global digit lines according to one example of the invention.

One example of a circuit 50 that can be used for the coupling circuits 30 is shown in FIG. 2. The coupling circuit 50 includes an NMOS transistor 54 having its drain coupled to a supply voltage V, its gate coupled to a local digit line 20 or 22, and its source coupled to the global digit line 14 or 16. A second NMOS transistor 58 has its source coupled to the local digit line 20 or 22, and its drain coupled to the global digit line 14 or 16. The gate of the transistor 58 is coupled to a global word line GWL.

In operation, the precharge circuit 18 (FIG. 1) initially precharges the global digit lines 14, 16 to zero volts. One of the word lines WL is then activated to couple a capacitor 40 in one of the memory cells 38 to the local digit line 20 or 22. A substantial portion of the voltage stored by the capacitor 40 is coupled to the local digit line 20 or 22, thereby turning ON the transistor 54. The transistor 54 then couples the local digit line 20 or 22 to the supply voltage V until the voltage of the global digit line 14 or 16 has risen to the voltage on the local digit line 20 or 22 less the threshold voltage $V_T$ of the transistor 54. The sense amplifier 12 or SA (FIG. 1) then senses the value of one or more bits stored in the memory cell capacitor 40 that is coupled to the local digit line 20 or 22.

If the capacitor 40 being sensed is charged to zero volts, the voltage of the local digit line 20 or 22 simply remains at zero volts. As a result, the voltage on the local digit line 20 or 22 does not turn ON the transistor 54, so the global digit line 14 or 16 simply remains at its precharge value of zero volts.

After the sense amplifier 12 has sensed the voltage stored in the memory cell capacitor 40, it must "write back" that voltage to the capacitor to refresh the voltage on the capacitor 40. This is accomplished by activating the global word line GWL, thereby turning on the transistor 58. The transistor 58 then couples the sense amplifier 12 to the capacitor 40. Turning ON the transistor 58 does not allow the transistor 54 to turn ON because its gate and source are coupled to each other by the transistor 58.

After the sensed voltage has been written back to the capacitor 40 of the memory cell 38 being sensed, the word line WL is deactivated, thereby isolating the capacitor 40 from the local digit line 20 or 22. The global digit line 14 or 16 is then precharged again to zero volts, which also precharges the local digit line 20 or 22 through the ON transistor 58. Finally, the global word line GWL is deactivated to turn OFF the transistor 58.

In the embodiment of FIGS. 1 and 2, the same voltage that is sensed is written back to the capacitor 40 of the memory cell 38. However, in other embodiments (not shown), a voltage that is different from the voltage sensed may be written back to the capacitor 40 of the memory cell 38. In such cases, there may be a translation of the voltage by the sense amplifier 12.

The use of short local digit lines 20, 22 coupled to long global digit lines through a coupling circuit 30 formed by an amplifier having current gain characteristics may provide several advantages. In particular, it may be possible to reduce the capacitance of the memory cell capacitors 40, thereby allowing DRAM devices to be more compact and thus cheaper and faster. Reduced requirements in the size of the capacitors 40 may enable less complex, and hence lower cost, processes to be used to make DRAM devices, and/or the yield of fabricating DRAM devices may be increased. Furthermore, since the signal-to-noise ratio of data signals transferred from the memory cell capacitors 40 to the local digit lines 20, 22 can be higher, it may be possible to sense multiple voltage levels stored by the capacitors 40, thus allowing each capacitor 40 to store multiple bits.

Figure 3:
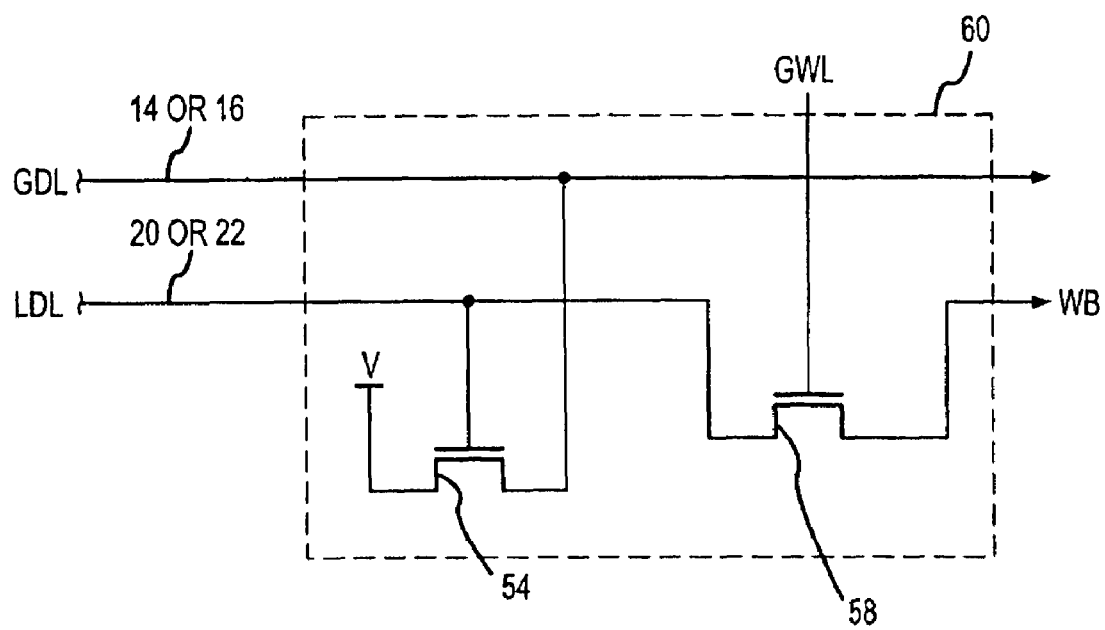
FIG. 3 is a schematic diagram showing another example of a circuit that can be used to couple local digit lines to global digit lines in the DRAM array of FIG. 1.

Another example of a coupling circuit 60 that can be used as the coupling circuit 30 of FIG. 1 is shown in FIG. 3. The coupling circuit 60 uses the transistor 54 to couple the local digit lines 20, 22 to the global digit lines 14, 16, respectively, in the same manner as the coupling circuit 50 shown in FIG. 2. The coupling circuit 60 differs from the coupling circuit 50 by using the transistor 58 to couple the local bit lines 20, 22 to a write back WB signal for write back purposes rather than to the global bit lines 14, 16. The coupling circuit 60 allows independence of the voltage sensed by the sense amplifier and the voltage written back to the memory cell capacitor 40. Although the coupling circuit 60 requires an additional layer of digit line interconnections compared to the coupling circuit 50, it may be possible for the coupling circuit 60 to allow the sensing of the voltage stored in the capacitor and write back of a voltage to the capacitor 40 to occur faster and possibly more simply.

In another embodiment (not shown), the write back WB signal is generated by placing a write back voltage WB' on a local digit line 20 or 22 that is different from the local digit line being sensed. The global write line GWL coupled to the transistor 58 for the local digit line 20 or 22 supplying the write back voltage WB' is then activated to couple the write back voltage WB' to the digit line 20 or 22 being sensed through the transistor 58 for that digit line 20 or 22.

Figure 4:
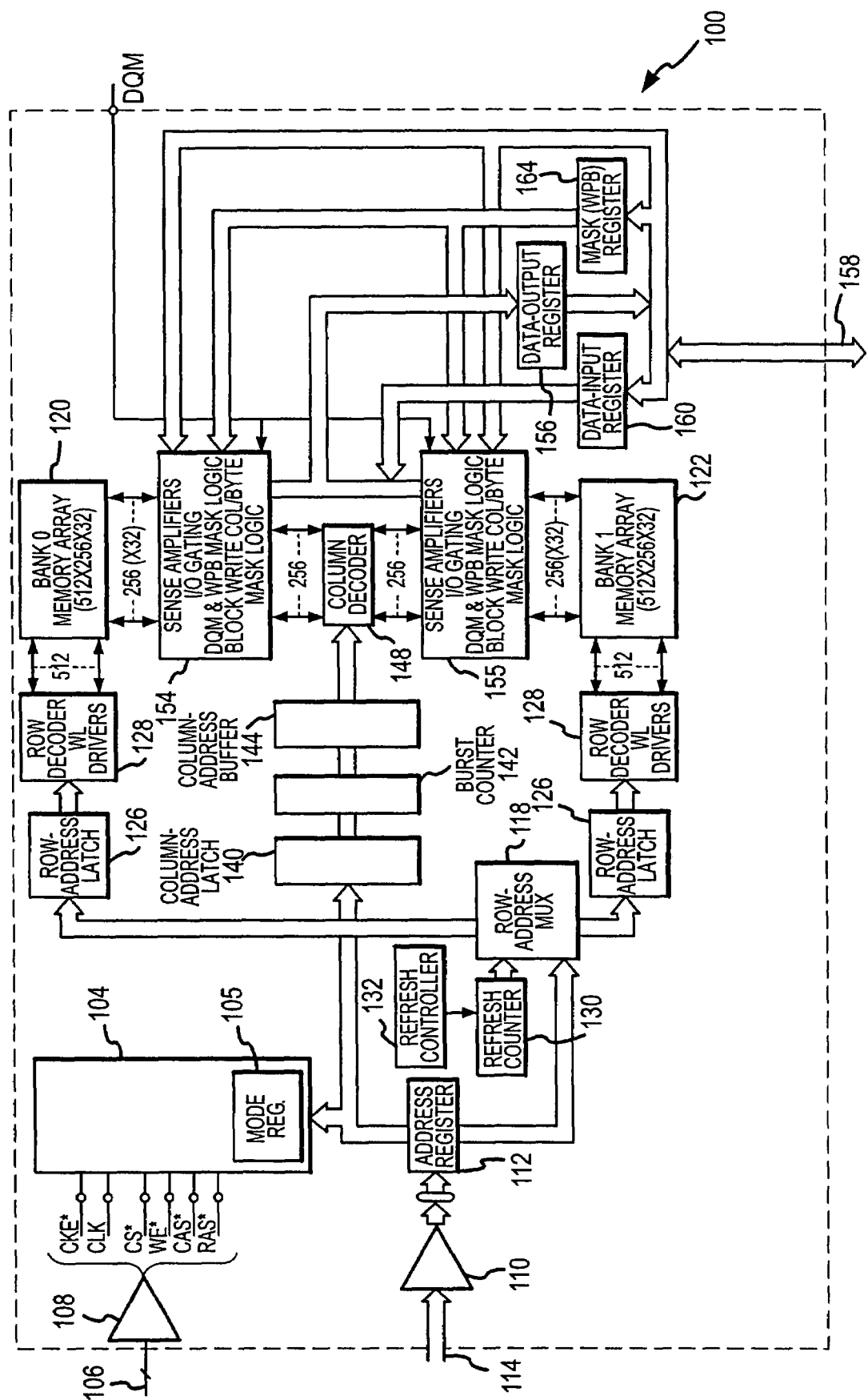
FIG. 4 is a block diagram of a DRAM device using the DRAM array of FIG. 1 or some other example of the invention.

The DRAM array 10 shown in FIG. 1 or some other example of the invention can be used in a wide variety of DRAM devices. For example, as shown in FIG. 4, a synchronous dynamic random access memory ("SDRAM") 100 includes a command decoder 104 that controls the operation of the SDRAM 100 responsive to high-level command signals received on a control bus 106 and coupled through input receivers 108. These high level command signals, which are typically generated by a memory controller (not shown in FIG. 4), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 104 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 100 includes an address register 112 that receives row addresses and column addresses through an address bus 114. The address bus 114 is generally coupled through input receivers 110 and then applied to a memory controller (not shown in FIG. 4). A row address is generally first received by the address register 112 and applied to a row address multiplexer 118. The row address multiplexer 118 couples the row address to a number of components associated with either of two memory arrays 120, 122 depending upon the state of a bank address bit forming part of the row address. The memory arrays 120, 122 use the architecture shown in FIG. 1 or some other example of a DRAM array architecture according to the invention. In one embodiment, the memory cell capacitors 40 (FIG. 1) store either of two voltages corresponding to a single bit. In another embodiment, the memory cell capacitors 40 store one of $2^N$ voltages corresponding to a N bits. Associated with each of the memory banks 120, 122 is a respective row address latch 126, which stores the row address, and a row decoder 128, which decodes the row address and applies corresponding signals to one of the arrays 120 or 122. The row address multiplexer 118 also couples row addresses to the row address latches 126 for the purpose of refreshing the memory cells in the arrays 120, 122. The row addresses are generated for refresh purposes by a refresh counter 130, which is controlled by a refresh controller 132. The refresh controller 132 is, in turn, controlled by the command decoder 104.

After the row address has been applied to the address register 112 and stored in one of the row address latches 126, a column address is applied to the address register 112. The address register 112 couples the column address to a column address latch 140. Depending on the operating mode of the SDRAM 100, the column address is either coupled through a burst counter 142 to a column address buffer 144, or to the burst counter 142 which applies a sequence of column addresses to the column address buffer 144 starting at the column address output by the address register 112. In either case, the column address buffer 144 applies a column address to a column decoder 148.

Data to be read from one of the arrays 120, 122 is coupled to the column circuitry 154, 155 for one of the arrays 120, 122, respectively. The column circuitry 154, 155 includes the sense amplifiers 12 (FIG. 1) and precharge circuits 18. In the example of the array 120, 122 in which the memory cells capacitors 40 each store a single bit of data, the sense amplifiers 12 sense either of two voltage levels. In the example of the array 120, 122 in which the memory cells capacitors 40 each store N bits of data, the sense amplifiers 12 sense any of $2^N$ voltage levels. The read data signals sensed by the sense amplifiers 12 is then coupled through a data output register 156 to a data bus 158. Data to be written to one of the arrays 120, 122 are coupled from the data bus 158 through a data input register 160. The write data are coupled to the column circuitry 154, 155 where they are transferred to one of the arrays 120, 122, respectively. A mask register 164 responds to a data mask DM signal to selectively alter the flow of data into and out of the column circuitry 154, 155, such as by selectively masking data to be read from the arrays 120, 122.

Figure 5:
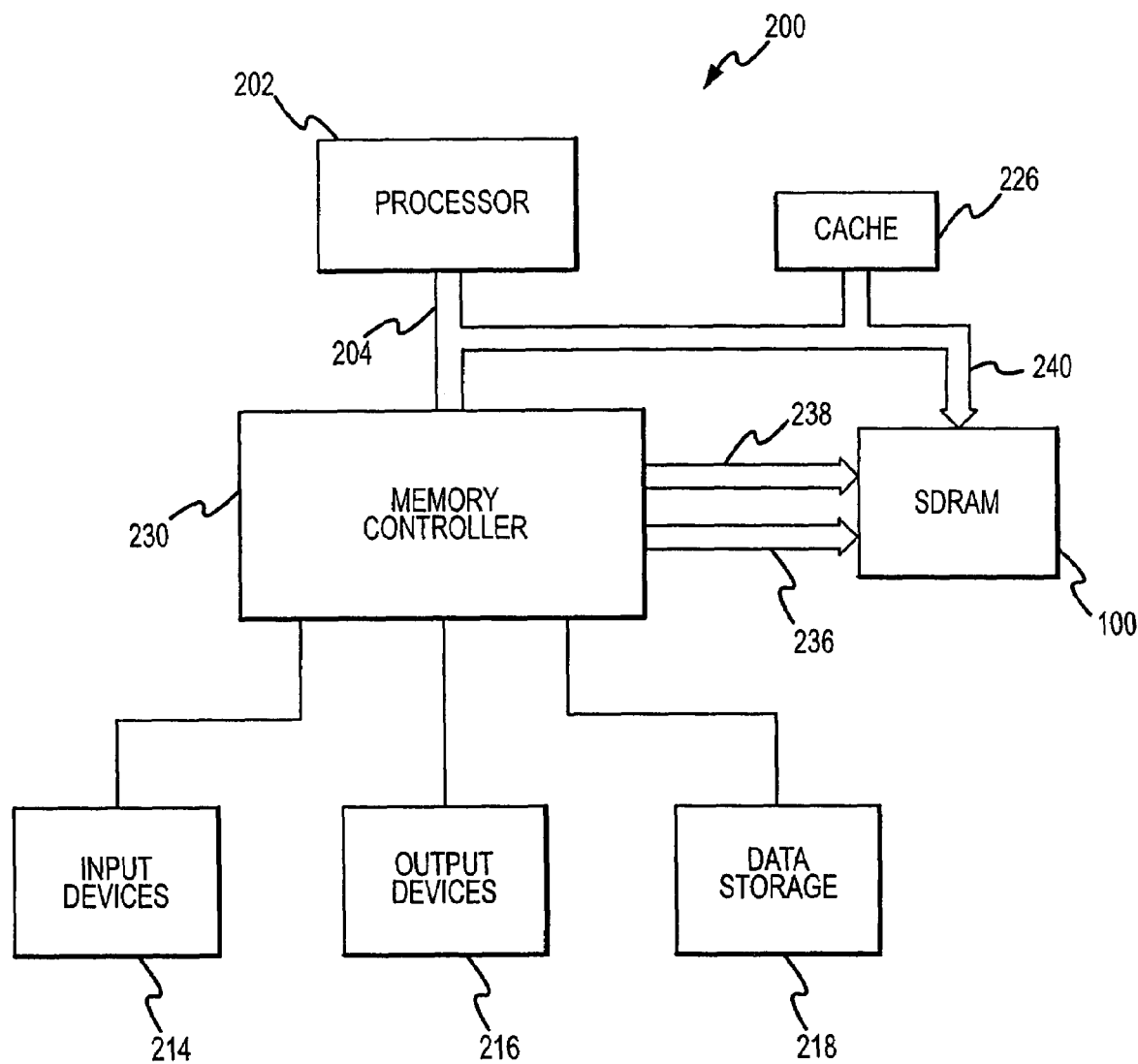
FIG. 5 is a block diagram of a computer system according to one example of the invention.

The SDRAM 100 shown in FIG. 4 can be used in various electronic systems. For example, it may be used in a processor-based system, such as a computer system 200 shown in FIG. 5. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM"), and to the SDRAM 100 through a memory controller 230. The memory controller 230 normally includes a control bus 236 and an address bus 238 that are coupled to the SDRAM 100. A data bus 240 is coupled from the SDRAM 100 to the processor bus 204 either directly (as shown), through the memory controller 230, or by some other means.

Although the invention has been described with reference to the disclosed embodiments, persons skilled in the art will recognize that changes may be made in form and detail without departing from the spirit and scope of the invention. For example, although the examples of the invention use NMOS transistors, it will be understood that PMOS transistors, bipolar transistors or other devices could be used. Such modifications are well within the skill of those ordinarily skilled in the art. Accordingly, the invention is not limited except as by the appended claims.

We claim:

1. A memory array arranged in rows and columns, each of the columns of the memory array comprising:
   a sense amplifier for the respective column of memory cells operable to sense a voltage difference applied between first and second inputs;
   first and second global digit lines coupled to the first and second inputs of the sense amplifier, respectively, for the respective column of memory cells;
   a first plurality of local digit lines each of which is selectively coupled to a first plurality of memory cells in the same column of the memory array;
   a second plurality of local digit lines each of which is coupled to a second plurality of memory cells in the memory array that are different from the memory cells in the first plurality, the plurality of memory cells to which the digit lines in the second plurality are coupled being in the same column as the plurality of memory cells to which the digit lines in the first plurality are coupled;
   a third plurality of local digit lines each of which is coupled to a third plurality of memory cells in the memory array that are different from the memory cells in the first and second pluralities, the plurality of memory cells to which the digit lines in the third plurality are coupled being in the same column as the plurality of memory cells to which the digit lines in the first and second pluralities are coupled;
   a fourth plurality of local digit lines each of which is coupled to a fourth plurality of memory cells in the memory array that are different from the memory cells in the first, second and third pluralities, the plurality of memory cells to which the digit lines in the fourth plurality are coupled being in the same column as the plurality of memory cells to which the digit lines in the first, second and third pluralities are coupled; and
   respectively coupling circuits selectively coupling each of the local digit lines in the first and third pluralities of memory cells to the first global digit lines and each of the local digit lines in the second and fourth pluralities of memory cells to the second global digit line, each of the coupling circuits including a first transistor having its gate coupled to the local digit line, and its source and drain respectively coupled between a specific voltage and the global digit line, each of the coupling circuits further comprising a second transistor having its gate coupled to receive a global word line voltage and its source and drain respectively coupled between the local digit line and the global digit line.

2. The memory array of claim 1, further comprising a precharge circuit coupled to the first and second global digit lines, the precharge circuit being operable to selectively bias the first and second global digit lines to first and second precharge voltages.

3. The memory array of claim 2 wherein the precharge circuit is further operable to selectively bias the local digit lines in the first and third pluralities to the first precharge voltage, and to selectively bias the local digit lines in the second and fourth pluralities to the second precharge voltage.

4. The memory array of claim 3 wherein the first and second precharge voltages comprises a first of at least two voltages that are stored by each of the memory cells, and wherein each of the coupling circuits comprises an amplifier circuit that couples any change from the first voltage in the respective local digit line to the global digit line.

5. The memory array of claim 1 wherein each of the coupling circuits comprise an amplifier having current gain characteristics.

6. The memory array of claim 1 wherein each of the memory cells is operable to store N bits, and wherein the sense amplifier is operable to sense voltages in $2^N$ distinct ranges, where N is a positive plural integer.

7. The memory array of claim 1 wherein the memory cells comprise dynamic random access memory cells.

8. A memory device, comprising:
a row address circuit operable to receive and decode row address signals applied to external address terminals of the memory device;
a column address circuit operable to receive and decode column address signals applied to the external address terminals; and
a memory array operable to store data written to and read from the array at a location determined by the decoded row address signals and the decoded column address signals, the memory array arranged in rows and columns, each of the columns of the memory array comprising:
  a sense amplifier for the respective column of memory cells operable to sense a voltage difference applied between first and second inputs;
  first and second global digit lines coupled to the first and second inputs of the sense amplifier, respectively, for the respective column of memory cells;
  a first plurality of local digit lines each of which is selectively coupled to a first plurality of memory cells in the same column of the memory array;
  a second plurality of local digit lines each of which is coupled to a second plurality of memory cells in the memory array that are different from the memory cells in the first plurality, the plurality of memory cells to which the digit lines in the second plurality are coupled being in the same column as the plurality of memory cells to which the digit lines in the first plurality are coupled;
  a third plurality of local digit lines each of which is coupled to a third plurality of memory cells in the memory array that are different from the memory cells in the first and second pluralities, the plurality of memory cells to which the digit lines in the third plurality are coupled being in the same column as the plurality of memory cells to which the digit lines in the first and second pluralities are coupled;
  a fourth plurality of local digit lines each of which is coupled to a fourth plurality of memory cells in the memory array that are different from the memory cells in the first, second and third pluralities, the plurality of memory cells to which the digit lines in the fourth plurality are coupled being in the same column as the plurality of memory cells to which the digit lines in the first, second and third pluralities are coupled;
  respective coupling circuits selectively coupling each of the local digit lines in the first and third pluralities of memory cells to the first global digit line and each of the local digit lines in the second and fourth pluralities of memory cells to the second global digit line, each of the coupling circuits including a first transistor having its gate coupled to the local digit line, and its source and drain respectively coupled between a specific voltage and the global digit line, each of the coupling circuits further comprising a second transistor having its gate coupled to receive a global word line voltage and its source and drain respectively coupled between the local digit line and the global digit line;
a read data path circuit operable to couple read data signals from the memory cell array to external data terminals of the memory device;
a write data path circuit operable to couple write data signals from the external data terminals of the memory device responsive to the memory cell array; and
a command decoder operable to decode a plurality of command signals applied to respective external command terminals of the memory device, the command decoder being operable to generate control signals corresponding to the decoded command signals.

9. The memory device of claim 8, further comprising a precharge circuit coupled to the first and second global digit lines, the precharge circuit being operable to selectively bias the first and second global digit lines to first and second precharge voltages.

10. The memory device of claim 9 wherein the precharge circuit is further operable to selectively bias the local digit lines in the first and second pluralities to the first and second precharge voltages, respectively.

11. The memory device of claim 10 wherein the first and second precharge voltages comprises a first of at least two voltages that are stored by each of the memory cells, and wherein each of the coupling circuits comprises an amplifier circuit that couples any change from the first voltage in the respective local digit line to the global digit line.

12. The memory device of claim 8 wherein each of the coupling circuits comprise an amplifier having current gain characteristics.

13. The memory device of claim 8 wherein each of the memory cells is operable to store N bits, and wherein the sense amplifier is operable to sense voltages in $2^N$ distinct ranges, where N is a positive plural integer.

14. The memory device of claim 8 wherein the memory cells comprise dynamic random access memory cells.

15. A processor-based system, comprising:
a processor having a processor bus;
an input device coupled to the processor through the processor bus adapted to allow data to be entered into the computer system;
an output device coupled to the processor through the processor bus adapted to allow data to be output from the computer system; and
a memory device coupled to the processor bus adapted to allow data to be stored, the memory device comprising:
  a row address circuit operable to receive and decode row address signals applied to external address terminals of the memory device;
  a column address circuit operable to receive and decode column address signals applied to the external address terminals; and
  a memory array operable to store data written to and read from the array at a location determined by the decoded row address signals and the decoded column address signals, the memory array arranged in rows and columns, each of the columns of the memory array comprising:
    a sense amplifier for the respective column of memory cells operable to sense of a voltage difference applied between first and second inputs;
    first and second global digit lines coupled to the first and second inputs of the sense amplifier, respectively, for the respective column of memory cells;
    a first plurality of local digit lines each of which is selectively coupled to a first plurality of memory cells in the same column of the memory array;

a second plurality of local digit lines each of which is coupled to second plurality of memory cells in the memory array that are different from the memory cells in the first plurality, the plurality of memory cells to which the digit lines in the second plurality are coupled being in the same column as the plurality of memory cells to which the digit lines in the first plurality are coupled;

a third plurality of local digit lines each of which is coupled to a third plurality of memory cells in the memory array that are different from the memory cells in the first and second pluralities, the plurality of memory cells to which the digit lines in the third plurality are coupled being in the same column as the plurality of memory cells to which the digit lines in the first and second pluralities are coupled;

a fourth plurality of local digit lines each of which is coupled to a fourth plurality of memory cells in the memory array that are different from the memory cells in the first, second and third pluralities, the plurality of memory cells to which the digit lines in the fourth plurality are coupled being in the same column as the plurality of memory cells to which the digit lines in the first, second and third pluralities are coupled;

respective coupling circuits selectively coupling each of the local digit lines in the first and third pluralities of memory cells to the first global digit line and each of the local digit lines in the second and fourth pluralities of memory cells to the second global digit line, each of the coupling circuits including a first transistor having its gate coupled to the local digit line, and its source and drain respectively coupled between a specific voltage and the global digit line, each of the coupling circuits further comprising a second transistor having its gate coupled to receive a global word line voltage and its source and drain respectively coupled between the local digit line and the global digit line;

a read data path circuit operable to couple read data signals from the memory cell array to external data terminals of the memory device;

a write data path circuit operable to couple write data signals from the external data terminals of the memory device responsive to the memory cell array; and a command decoder operable to decode a plurality of command signals applied to respective external command terminals of the memory device, the command decoder being operable to generate control signals corresponding to the decoded command signals.

16. The processor based system of claim 15, further comprising a precharge circuit coupled to the first and second global digit lines, the precharge circuit being operable to selectively bias the first and second global digit lines to first and second precharge voltages.

17. The processor based system of claim 16 wherein the precharge circuit is further operable to selectively bias the local digit lines in the first and second pluralities to the first and second precharge voltages, respectively.

18. The processor based system of claim 17 wherein the first and second precharge voltages comprises a first of at least two voltages that are stored by each of the memory cells, and wherein each of the coupling circuits comprises an amplifier circuit that couples any change from the first voltage in the respective local digit line to the global digit line.

19. The processor based system of claim 14 wherein each of the coupling circuits comprise an amplifier having current gain characteristics.

20. The processor based system of claim 14 wherein each of the memory cells is operable to store N bits, and wherein the sense amplifier is operable to sense voltages in $2^N$ distinct ranges, where N is a positive plurality integer.

21. The processor based system of claim 14 wherein the memory cells comprise dynamic random access memory cells.

22. A method of storing and reading data in a plurality of memory cells arranged in an array of rows and columns, the method comprising:

storing N bits of data in each of the memory cells in a memory array;

selectively coupling each of the memory cells in respective columns of the memory array to one of a plurality of local digit lines, each of the local digit lines being selectively coupled to substantially less than all of the memory cells in the respective column in the memory array;

selectively coupling a voltage on one of the plurality of local digit lines in the memory array to a gate of a first transistor that has its source and drain respectively coupled between a specific voltage and a global digit line, the global digit line being provided for each of the columns of memory cells in the array, the global digit line being selectively coupled only to each of the plurality of the local digit lines for the respective column of memory cells in the memory array;

using a second transistor to selectively couple each of the plurality of local digit lines to the global digit line; and sensing a voltage on the global digit line to read the data stored in one of the memory cells in the memory array to which the plurality of local digit lines are coupled.

23. The method of claim 22 wherein the memory cells comprises respective dynamic random access memory cells.

24. The method of claim 22 wherein the act of selectively coupling a voltage on the local digit line to a global digit line comprises coupling a supply voltage to the global digit line until a voltage on the global digit line reaches substantially the voltage on the local digit line.

25. The method of claim 22 wherein the act of selectively coupling the voltage on the local digit line to a global digit line comprises coupling the local digit line to the global digit line through a current amplifier.

26. The method of claim 22, further comprising precharging the local digit lines and the global digit lines to respective first and second precharge voltages.

27. The method of claim 26 wherein the act of precharging the local digit lines and the global digit lines to respective first and second precharge voltages comprises precharging the local digit lines to respective voltages that are the same as voltages to which the global digit lines are precharged.

28. The method of claim 27 wherein the act of precharging the local digit lines and the global right lines comprises:

coupling the local digit line to the global digit line; and precharging the global digit line to the precharge voltage.

* * * * *

UNITED STATES PATENT AND TRADEMARK OFFICE
CERTIFICATE OF CORRECTION

PATENT NO. : 7,613,024 B2
APPLICATION NO. : 11/983617
DATED : November 3, 2009
INVENTOR(S) : H. Montgomery Manning et al.

It is certified that error appears in the above-identified patent and that said Letters Patent is hereby corrected as shown below:

In column 8, line 36, in Claim 1, delete "respectively" and insert -- respective --, therefor.

In column 8, line 37, in Claim 1, delete "lines" and insert -- line --, therefor.

In column 10, line 60, in Claim 15, after "sense" delete "of".

In column 12, line 4, in Claim 19, delete "claim 14" and insert -- claim 15 --, therefor.

In column 12, line 7, in Claim 20, delete "claim 14" and insert -- claim 15 --, therefor.

In column 12, line 10, in Claim 20, delete "plurality" and insert -- plural --, therefor.

In column 12, line 11, in Claim 21, delete "claim 14" and insert -- claim 15 --, therefor.

In column 12, line 59, in Claim 28, delete "right" and insert -- digit --, therefor.

Signed and Sealed this

Twenty-ninth Day of December, 2009

David J. Kappos
*Director of the United States Patent and Trademark Office*